United States Patent
Chen

(10) Patent No.: US 10,134,474 B1
(45) Date of Patent: Nov. 20, 2018

(54) INDEPENDENT STATE COMPLETION FOR EACH PLANE DURING FLASH MEMORY PROGRAMMING

(71) Applicant: SanDisk Technologies LLC, Plano, TX (US)

(72) Inventor: Yi-Chieh Chen, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/789,095

(22) Filed: Oct. 20, 2017

(51) Int. Cl.
| | |
|---|---|
| G11C 16/04 | (2006.01) |
| G11C 16/12 | (2006.01) |
| G11C 16/26 | (2006.01) |
| G06F 3/06 | (2006.01) |
| G11C 16/34 | (2006.01) |

(52) U.S. Cl.
CPC .............. *G11C 16/12* (2013.01); *G06F 3/061* (2013.01); *G06F 3/0656* (2013.01); *G06F 3/0679* (2013.01); *G11C 16/26* (2013.01); *G11C 16/3459* (2013.01)

(58) Field of Classification Search
CPC ............ G11C 11/5628; G11C 11/5642; G11C 16/3459; G11C 7/1021
See application file for complete search history.

(56) References Cited

U.S. PATENT DOCUMENTS

| | | | |
|---|---|---|---|
| 5,798,968 A | 8/1998 | Lee et al. | |
| 5,890,192 A | 3/1999 | Lee et al. | |
| 6,426,893 B1 * | 7/2002 | Conley | G06F 12/0246 365/185.09 |
| 6,717,851 B2 | 4/2004 | Mangan et al. | |
| 7,023,736 B2 | 4/2006 | Cernea et al. | |
| 7,688,638 B2 | 3/2010 | Hemink | |
| 7,894,273 B2 | 2/2011 | Li et al. | |
| 8,054,691 B2 | 11/2011 | Hemink | |
| 8,427,884 B2 | 4/2013 | Liu et al. | |
| 8,456,915 B2 | 6/2013 | Chen et al. | |
| 8,830,745 B2 | 9/2014 | Mui et al. | |
| 9,013,924 B2 * | 4/2015 | Yang | G11C 11/5642 365/185.14 |
| 9,276,203 B2 | 3/2016 | Hsueh et al. | |
| 9,570,160 B1 | 2/2017 | Shah et al. | |

(Continued)

OTHER PUBLICATIONS

Chan et al., "A True Single-Transistor Oxide-Nitride-Oxide EEPROM Device," IEEE Electron Device Letters, vol. EDL-8, No. 3, Mar. 1987, pp. 93-95.

(Continued)

*Primary Examiner* — Tuan T Nguyen
(74) *Attorney, Agent, or Firm* — Foley & Lardner LLP

(57) ABSTRACT

An apparatus includes a first plane of memory cells including an associated first buffer, a second plane of memory cells including an associated second buffer. The apparatus also includes a controller configured to transfer data corresponding to a first memory state the first buffer and transfer data corresponding to a second memory state to the second buffer. The apparatus also includes state machine configured to apply program pulses to the first and second planes of memory cells. The apparatus also includes read/write circuitry configured to independently confirm that the first and second planes of memory cells have reached the first and second memory states.

20 Claims, 10 Drawing Sheets

(56) References Cited

U.S. PATENT DOCUMENTS

| | | |
|---|---|---|
| 9,620,238 B2 | 4/2017 | Khandelwal et al. |
| 2004/0109357 A1 | 6/2004 | Cernea et al. |
| 2006/0140007 A1 | 6/2006 | Cernea et al. |
| 2007/0127295 A1* | 6/2007 | Kato ................ G11C 8/08 365/185.18 |
| 2008/0123411 A1* | 5/2008 | Crippa ............ G11C 7/1021 365/185.03 |
| 2010/0257308 A1 | 10/2010 | Hsu et al. |
| 2010/0329005 A1* | 12/2010 | Yang ............ G11C 11/5628 365/185.03 |
| 2011/0063918 A1* | 3/2011 | Pei ................ G06F 11/1072 365/185.18 |
| 2016/0322109 A1* | 11/2016 | Kim ................ G11C 16/10 |
| 2017/0076802 A1 | 3/2017 | Mokhlesi |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

Nozaki et al., "A 1-Mb EEPROM with MONOS Memory Cell for Semiconductor Disk Application," IEEE Journal of Solid-State Circuits, vol. 26, No. 4, Apr. 1991, pp. 497-501.

* cited by examiner

US 10,134,474 B1

INDEPENDENT STATE COMPLETION FOR EACH PLANE DURING FLASH MEMORY PROGRAMMING

BACKGROUND

Recently, there has been a trend to downsize memory cells to improve memory capacity. Such downsizing creates potential difficulties in the programming of memory cells. For example, downsizing may result in a greater number of manufacturing defects, such as shorting between adjacent word lines, shorting between word lines and interconnects, shorting between word lines and the substrate, broken word lines, etc. These defects often result in corruption of data stored on word lines during the programming process. Additionally, these defects result in variations in the speed of programming of memory cells. As a result, programming differently-located memory cells may take differing amounts of time.

SUMMARY

One embodiment relates to an apparatus. The apparatus includes a first plane of memory cells including an associated first buffer, a second plane of memory cells including an associated second buffer, and a controller. The controller is configured to transfer data corresponding to a first memory state to the first buffer, and transfer data corresponding to a second memory state to the second buffer. The apparatus also includes a state machine configured to apply program pulses to the first and second planes of memory cells and read/write circuitry configured to confirm that the first plane of memory cells has reached the first memory state and independently confirm that the second plane of memory cells has reached the second memory state by determining a number of memory cells in the first plane that have been programmed to the first memory state based on the data transferred to the first buffer and by determining a number of memory cells in the second plane that have been programmed to the second memory state based on the data transferred to the second buffer.

Another embodiment relates to a method including transferring data corresponding to different memory states to buffers associated with first and second planes of the array, applying program pulses to the first and second planes in parallel, and independently confirming that memory cells of the first and second planes of memory cells have reached the different memory states by identifying numbers of memory cells in the first and second planes that have been programmed to the different memory states based on the data transferred to the buffers.

Another embodiment relates to an apparatus. The apparatus includes a plurality of non-volatile memory cells, the plurality of non-volatile memory cells including a first set of non-volatile memory cells and a second set of non-volatile memory cells, a first set of data latches associated with the first set of non-volatile memory cells, a second set of data latches associated with the second set of non-volatile memory cells, and a controller. The controller is configured to send first data to the first set of data latches, the first data including data associated with a first memory state for a first portion of the first set of non-volatile memory cells, and send second data to the second set of data latches, the second data including data associated with the first memory state for a first portion of the second set of non-volatile memory cells. The apparatus also includes a state machine configured to transmit a first programming pulse of an initial voltage level to the first set of non-volatile memory cells and the second set of non-volatile memory cells, and one or more bitscan circuits configured to confirm that the first portion of the second set of non-volatile memory cells have reached the first memory state and that the first portion of the first set of non-volatile memory cells has not reached the first memory state, wherein in response to confirming that the first portion of the second set of non-volatile memory cells has reached the second memory state, the controller is configured to send third data to the second set of data latches, the third data including data associated with a second memory state for a second portion of the second set of non-volatile memory cells.

Another embodiment relates to an apparatus including means for transferring data corresponding to different memory states to buffers associated with different planes of a memory array, means for applying programming pulses to the different planes, and means for confirming that target numbers of memory cells in each of the different planes have reached the different memory states.

Figure 1:
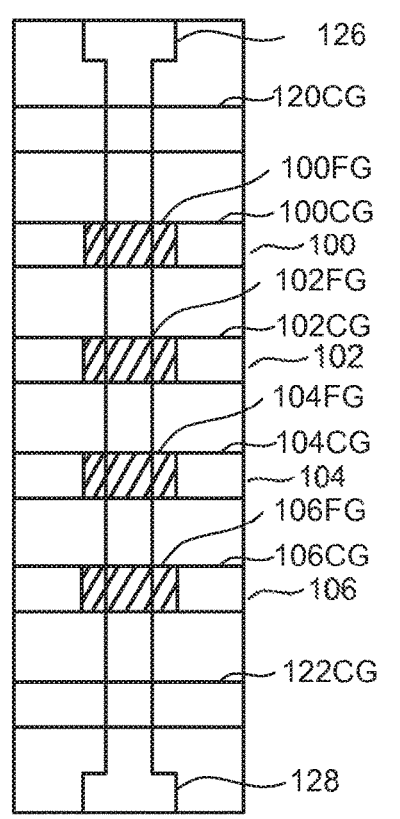
FIG. 1 is a top view of a NAND string, according to an example embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Referring generally to the figures, disclosed herein are systems and methods to limit program disturb in the process of programming multiple portions (e.g., planes) of a memory array of a memory device in parallel. Due to variations between the portions of the memory array, the portions may require different amounts of time to be programmed to target memory states. Such differences may cause issues in operation of the memory device. For example, conventional systems may employ a state-by-state data transfer and confirmation process for the entire memory array. In such a process, only when all of the portions of the memory array have been programmed to a first memory state will an additional data transfer and confirmation for a second memory state begin. Thus, the system will continue to apply programming pulses to each plane even if one plane finishes programming desired cells to the first memory state prior to another. In other words, the plane that first finishes programming to the first memory state will receive more program pulses than necessary, resulting in program disturb.

Disclosed herein is a system and method that addresses these deficiencies in conventional systems. Rather than a state-by-state data transfer and confirmation process for the entire memory array, the systems and methods disclosed herein employ independent data transfer and confirmation processes for each portion of the memory array. For example, the system may simultaneously transfer data corresponding to different memory states to buffers of bitscan circuits associated with first and second planes of the array. In an example, after a programming operation of a programming sequence, a read voltage associated with a first memory state may be applied to a first plane to cause a data transfer of first memory state data to the buffers of bitscan circuits associated with the first plane. A read voltage associated with a fourth memory state may be applied to a second plane to cause a data transfer of fourth state memory data to buffers associated with the fourth plane. If numbers of memory cells in the first and second planes that have reached the first and fourth states are above or equal to threshold values, the bitscan circuits are configured to advance to different memory states in subsequent programming cycles. For example, after having been confirmed to have reached the fourth memory state, the bitscan circuits associated with the second plane may apply a read voltage associated with a fifth memory state while the first plane is still at the first memory state. As a result, the second plane may advance to a final memory state of the programming sequence prior to the first plane. In various embodiments, once the second plane is confirmed to have reached the final memory state by associated bitscan circuits, the second plane can be inhibited as a whole from further programming irrespective of the current state of the first plane. As a result, variations in programming speed between planes does not result in significant program disturb.

As such, the systems and methods disclosed herein separately control circuitry utilized to confirm that threshold numbers of memory cells in the first and second planes have reached different memory states. This results in novel programming sequences for multi-plane memory arrays. While program pulses are applied in parallel to the different planes, different bitscan operations are performed at the same time in the different planes. In other words, data associated with different memory states is transferred to buffers (e.g., tag latches, data latches, etc.) associated with bitscan circuitry of each plane at the same time. As a result, a bitscan operation with respect to a final memory state in a programming sequence may be performed in one plane during a time when a bitscan operation with respect to a first memory state in the programming sequence is performed another plane. By enabling the inhibition of the one plane irrespective of the status of the other planes, program disturb is prevented in the faster plane.

One example of a non-volatile storage system that can implement the technology described herein is a flash memory system that uses the NAND structure, which includes arranging multiple transistors in series, sandwiched between two select gates. The transistors in series and the select gates are referred to as a NAND string.

Figure 2:
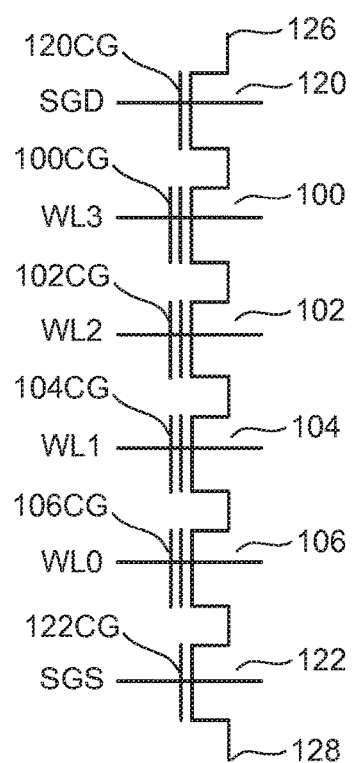
FIG. 2 is an equivalent circuit diagram of the NAND string, according to an example embodiment.

FIG. 1 is a top view of a NAND string 150 and FIG. 2 is an equivalent circuit diagram thereof. The NAND string 150 depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string 150 to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string 150, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

It should be noted that other types of non-volatile storage devices, in addition to NAND flash memory, can also be used to implement the new technology described herein. For example, a TANOS structure (consisting of layers of TaN—$Al_2O_3$—SiN—$SiO_2$ on a silicon substrate), which is a memory cell configured to trap charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. No. 7,005,350 discloses a non-volatile memory cell having a trapping dielectric sandwiched between two silicon dioxide layers. Multi-state data storage is implemented by separately reading the binary states of the spatially separated charge storage regions within the dielectric.

Other types of non-volatile memory technologies may also be used in conjunction with the technology disclosed herein. For example, any suitable type of solid-state storage media may be used, such as, among others, NOR flash memory, nano RAM ("NRAM"), magneto-resistive RAM ("MRAM"), phase change RAM ("PRAM"), Racetrack memory, Memristor memory, nanocrystal wire-based memory, silicon-oxide based sub-10 nanometer process memory, graphene memory, Resistive random-access memory ("ReRAM"), programmable metallization cell ("PMC"), conductive-bridging RAM ("CBRAM"), and the like, One example of a ReRAM memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. In another example embodiment, interface switching ReRAM is used. Examples of structures of interface switching ReRAM may be found in, for example, U.S. Pat. No. 9,276,203.

Magnetoresistive memory (MRAM) stores data by magnetic storage elements. The elements are formed from two ferromagnetic layers, each of which can hold a magnetization, separated, in some implementations, by a thin insulating layer. One of the two layers is a permanent magnet set to a particular polarity; the other layer's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. In some embodiments, Spin Orbit Torque MRAM, where the memory cells include separate read and write lines, is used.

Phase change memory (PCRAM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figure 3:
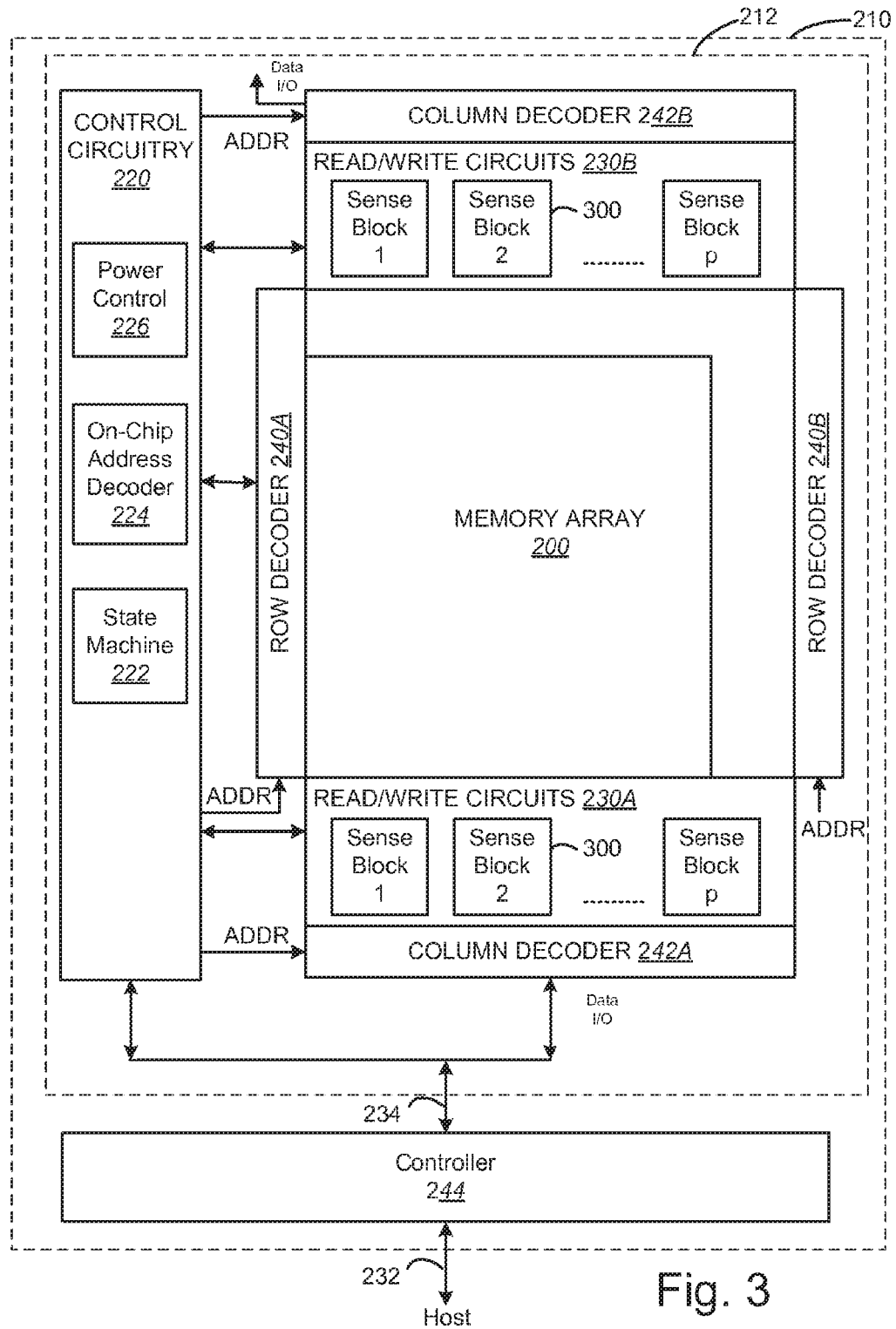
FIG. 3 is a block diagram of a non-volatile memory system, according to an example embodiment.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes a memory array 200 (two-dimensional or three dimensional) of memory cells, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control module 226, decoder 224, state machine 222, decoders 240 A/B & 242A/B, the read/write circuits 230A/B and the controller 244, collectively or separately, can be referred to as one or more managing circuits.

Figure 4:
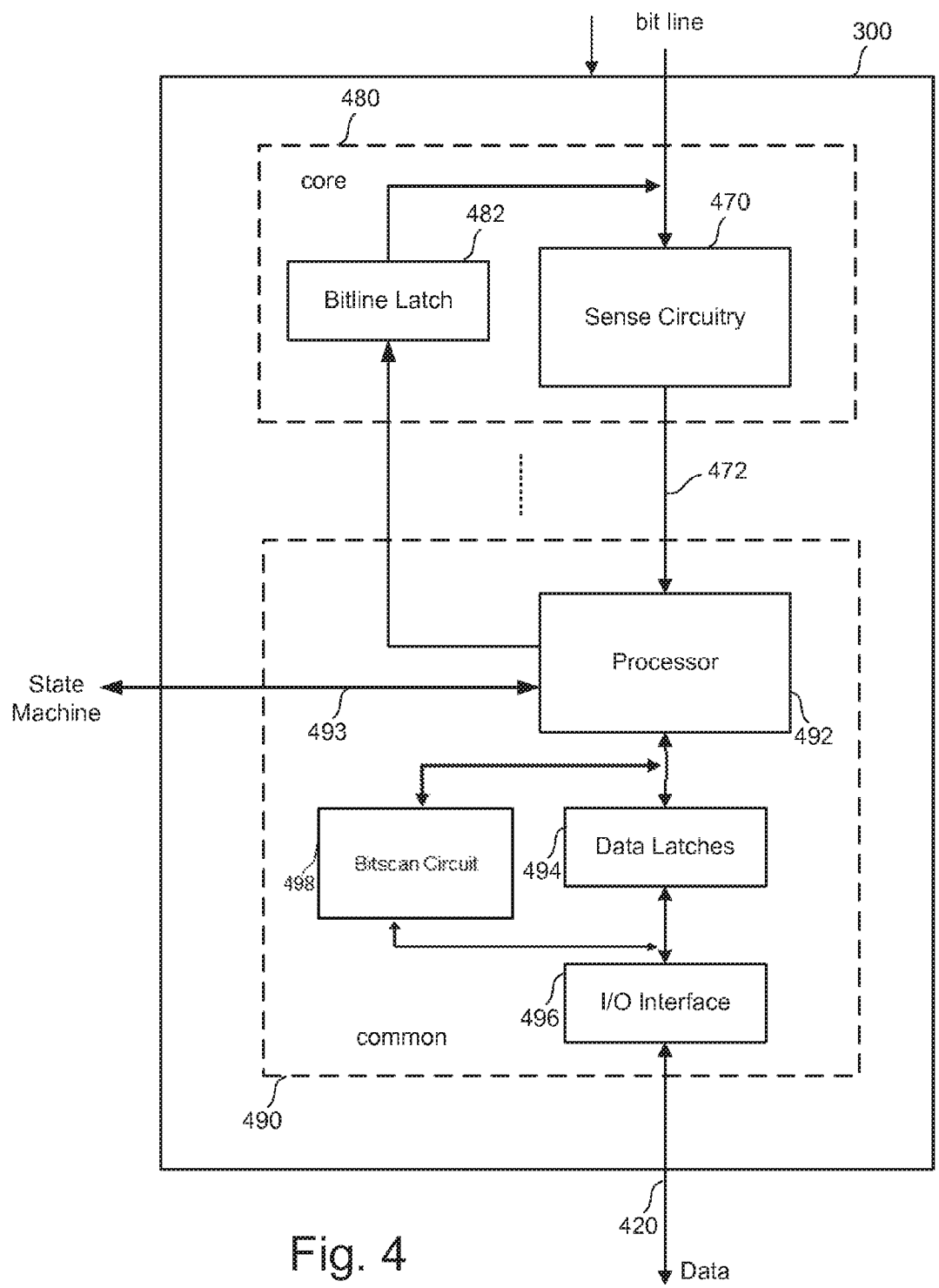
FIG. 4 is a block diagram detailing a sense block of the non-volatile memory system shown in FIG. 3, according to an example embodiment.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. As such, the set of data latches 494 are on-chip registers that serve as a data buffer for caching read and write data. The set of data latches 494 may include any combination of circuitry (e.g., inverters, gates, etc.) capable of temporary data storage. In some embodiments, the set of data latches 494 of each common portion 490 are connected in series to form a shift register so that parallel data stored therein is converted to serial data for the data bus 420 or vice versa. Data latches associated with any number of memory cells of the memory array 200 may be connected in this manner to facilitate serial data transfer to any portion of the memory array 200.

I/O interface 496 provides an interface between data latches 494 and the data bus 420. During a programming operation, the controller 244 may receive data from a host via lines 232. The controller 244 may initiate data transfers the received data to the data latches 494 by way of the I/O interface 496 of the common portion 490. As described herein, the controller may simultaneously transfer data associated with different memory states to data latches 494 associated with different planes of the memory array 200. As such, the controller 244 is, one example of a means for transferring data corresponding to different memory states to data latches associated with different planes of a memory array In some implementations, there are two sets of data latches 194 associated with a particular set of memory cells in the memory array 200. For example, a first set of data latches may store data to be programmed received, for example, via the I/O interface 496. A second set of data latches 194 may store data gathered during a verification step in the programming of the respective cells, described herein.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in come embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program, the data to be programmed is stored in the set of data latches 494 from the data bus 420. The program operation, under the control of the state machine 222, comprises a series of programming voltage pulses (with increasing magnitudes) concurrently applied to the control gates of the addressed memory cells so that the memory cells are programmed at the same time. As described herein, different portions (e.g., planes) of the memory array 200 may be programmed in parallel, which involves program pulses being applied simultaneously to different segments of the memory array. As such, the state machine 222 is one example of a means for simultaneously applying programming pulses to the different planes. Each programming pulse is followed by a verify process to determine if the memory cell has been programmed to the target memory state. The verify process is described in more detail with respect to FIG. 6C. Processor 492 monitors the verified memory state relative to the target memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments, the processor initially loads the bit line latch 482 and the sense circuitry sets it to an inhibit value during the verify process.

In some embodiments, each common portion 490 includes a bitscan circuit 498 associated with a set of sense modules 480. In another implementation, the bitscan circuits 498 are implemented within the control circuitry 220. In some embodiments, the memory device 210 includes a bitscan circuit 498 associated with any number of read/write circuits 230A/B such that a particular bitscan circuit 498 is associated with a predetermined subset (e.g., physical page) of memory cells in the memory array 200. Each bitscan circuit 498 is configured to count a number of cells that have reached a particular memory state during a particular programming loop. For example, during a verification operation performed during a programming process for a particular memory state, a read voltage associated with the memory state may be applied to the set of memory cells. Based on the returned data from the memory cells during the verification operation, the bitscan circuit 498 loads a binary string of data into a set of buffers (e.g., tag latches). Based on the binary string, the bitscan circuit 498 counts a number of memory cells that have been programmed to a target memory state. As described herein, if the count is below or equal to a threshold (e.g., a percentage that is below what can be corrected through ECC encoding), the programming operation is continued for the target memory state. In other words, an additional round of program pulses is applied to the set of memory cells and, in a subsequent bitscan operation, the bitscan circuit 498 re-counts the number of cells successfully programmed to the memory state. The bitscan circuit 498 may be configured to perform such operations in any manner. Examples of bitscan circuits and methods are described in U.S. Pat. No. 8,427,884 which is incorporated by reference in its entirety.

Referring back to FIG. 3, in order to increase the degree of parallelism, and thus improve performance of the memory device 210, the memory array 200 is typically divided into sub-arrays, commonly referred to as planes, which contain their own read/write circuits (e.g., similar to the read/write circuits 230A and 230B described with respect to FIG. 3) such that sectors of data may be programmed to or read from each of several or all the planes simultaneously. An array on a single integrated circuit may be physically divided into planes, or each plane may be formed from a separate one or more integrated circuit chips. Examples of such a memory implementation are described in U.S. Pat. Nos. 5,798,968 and 5,890,192.

Figure 5:
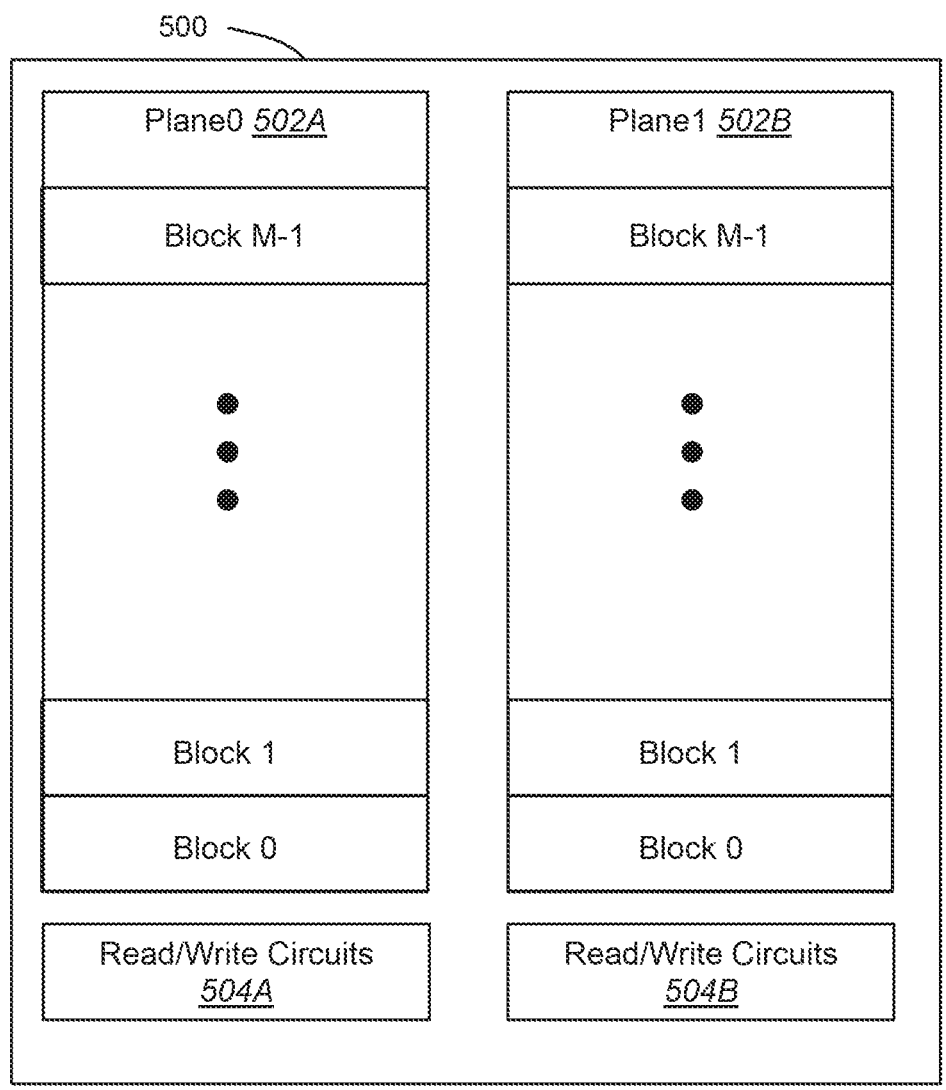
FIG. 5 is a block diagram of a memory array, according to an example embodiment.

FIG. 5 shows a memory array 500 including two planes 502A, 502B (plane0 and plane1), each having an array portion and separate associated read/write circuits 504A, 504B. For example, in various embodiments, the memory array 500 is an example structure of the memory array 200 described with respect to FIG. 3. As such, each of the read/write circuits 504A, 504B may have any combination of the elements described with respect to FIGS. 3-4.

As shown, each plane 502A and 502B is divided into M blocks. In various embodiments, each block includes a number of memory cells that can be erased together simultaneously. Each block is constructed of a plurality of columns of memory cells (e.g., NAND strings, as described with respect to FIGS. 1-3). The columns may be interconnected with one another (e.g., by sharing word lines). Interconnected memory cells of the columns in each block may be referred to as a physical page, as these sets of memory cells may be programmed simultaneously, as described herein. Pages in each of the planes 502A and 502B may be combined with one another to form various meta-pages to facilitate the simultaneous programming of larger chunks of data. In an example, each plane has about 2000 blocks.

In certain embodiments, the memory array 500 may have any suitable structure containing any number of planes and blocks. For example, in some embodiments, the memory array 500 is a cross-point memory array that includes memory cells placed at intersections of a first set of control lines (e.g., word lines) arranged in a first direction and a second set of control lines (e.g., bit lines) arranged in a second direction perpendicular to the first direction. A three-dimensional cross-point memory array includes vertical bit lines or bit lines that are arranged orthogonal to a semiconductor substrate. In one embodiment, where a three-dimensional cross-point memory array is used, the memory cells are resistance-switching memory cells. As such, the resistance (and thus inversely the conductance) of the individual memory cells typically is changed as a result of a voltage placed across the orthogonally intersecting conductors to which the memory cell is connected. Depending on the type of resistance-switching memory cell, the state may change in response to a voltage across it, a level of current though it, an amount of electric field across it, a level of heat applied to it, and the like.

Since each of the planes 502A and 502B includes separate read/write circuits 504A and 504B, memory cells in the planes 502A and 502B can be programmed simultaneously in parallel. For example, in response to receiving user data from the host to be programmed to the memory array 500, the control circuitry 220 may initiate a sequence to program various cells in the memory array 500. In this process, the control circuitry 220 may provide addresses to the memory array 500 to indicate locations in the memory data that are to be programmed. Data to be programmed to the indicated locations may then be provided by the controller 244 to the read/write circuits 504A and 504B for storage in data latches contained therein. In various embodiments, the data transferred corresponds to target memory states that the memory cells are to be programmed to. The memory cells are then programmed and verified via a process described with respect to FIGS. 6A-7. As such, a first set of bitscan circuits 498 associated with memory cells in the first plane 502A and a second set of bitscan circuits 498 associated with memory cells in the second plane 502A are used to verify whether target numbers of memory cells have reached target memory states. As such, the first and second sets of bitscan circuits 498 are examples of means for verifying that target numbers of memory cells in each of the different planes have reached the different memory states.

As described herein, the term "memory state" refers to a range (or distribution) of a measurable variable for memory cells in a memory array. The identity of the measurable variable depends on the type of non-volatile memory used. For example, where NAND structure is used, the measurable variable may be a voltage threshold value. The voltage threshold value is a voltage that is applied to a memory cell in order to permit conduction between the source and drain regions of the memory cell and is dependent on an amount of charge retained in a memory cell. Advantageously, the voltage threshold value can be adjusted and set to one or more different values. Each different value can be configured to represent a data value. In one embodiment, the voltage threshold is determined based on the injection of electrons into, for example, nitride dielectric layers of the memory cell. In one embodiment, the voltage threshold is determined by a charge level retained in a floating gate of the memory cell. In yet another example, where a resistive non-volatile memory structure (e.g., PCM, RERAM, Magnetoresitive RAM, MRAM) is used, the measurable variable corresponds to an electrical resistance of a memory cell. As referred to herein, the term "target memory state" refers to a desired range for the measurable variable for a particular memory cell.

Figure 6A:
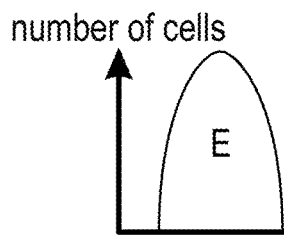
FIGS. 6A, 6B, 6C, 6D, 6E, 6F, and 6G are charts showing illustrative depictions of memory states and pulses used to program memory cells thereto, according to an example embodiment.
Figure 6B:
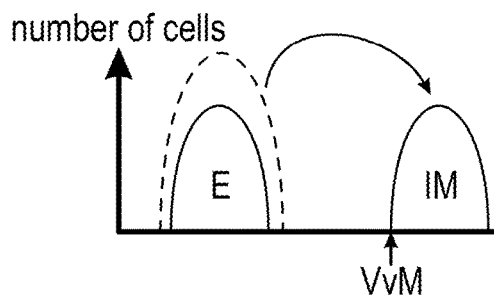

FIGS. 6A-6E show a programming process for a plurality of memory cells, according to an example embodiment. FIGS. 6A-6E illustrates a multi-phase programming approach. In this embodiment, the programming process includes three phases. Prior to programming, the memory cells are erased so that all memory cells connected to a common word line are in an erased threshold voltage distribution E, as depicted in FIG. 6A. During the first phase of programming, those memory cells whose targets memory cells (due to the data to be stored in those memory cells) are memory states S4, S5, S6 or S7 are programmed to an intermediate state IM. Those memory cells that are targeted for memory states S0, S1, S2 or S3 and remain in the erased threshold voltage distribution E. The first phase is graphically depicted by FIG. 6B. Memory cells being programmed to intermediate state IM are programmed to a target threshold voltage of VvIM.

Figure 6C:
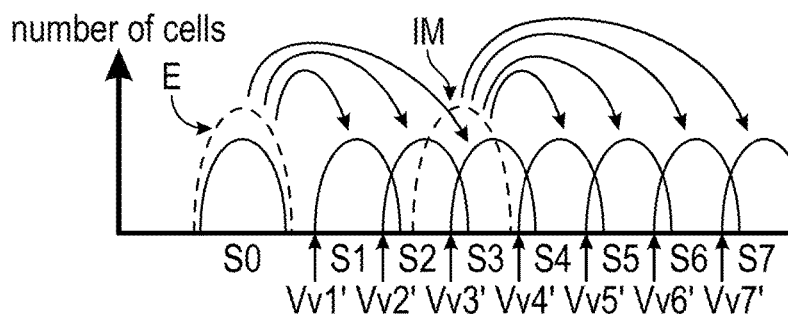
Figure 6D:
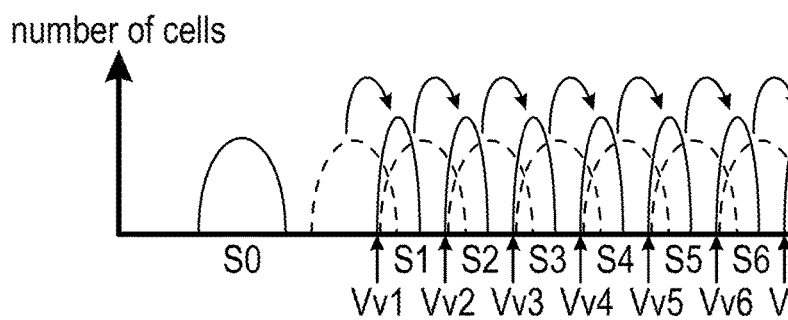

During the second phase of the programming process of FIGS. 6A-6E, those memory cells that are in the erased threshold voltage distribution E are programmed to their target memory states. For example, those memory cells to be programmed to memory state S3 are programmed from erased threshold voltage distribution E to memory state S3, those memory cells to be programmed to memory state S2 are programmed from erased threshold voltage distribution E to memory state S2, those memory cells to be programmed to memory state 51 are programmed from erase threshold voltage distribution E to memory state S1, and those memory cells to be in memory state S0 are not programmed during the second phase of the programming process. Thus, erased threshold voltage distribution E becomes memory state S0. Also, during the second phase, memory cells are programmed from the intermediate state IM to various memory states S4-S7. For example, those memory cells to be programmed to memory state S7 are programmed from the intermediate state IM to memory state S7, those memory cells targeted to be in memory state S6 are programmed from intermediate state IM to memory state S6, memory cells to be programmed to memory state S5 are programmed from intermediate state IM to memory state S5, and those memory cells to be programmed to memory state S4 are programmed from intermediate state IM to memory state S4. This second phase of programming is illustrated in FIG. 6C.

As can be seen in FIG. 6C, at the end of the second phase of programming memory states S1-S7 overlap with neighboring memory states. For example, memory state S1 overlaps with memory state S2, memory state S2 overlaps with memory states S1 and S3, memory state S3 overlaps with memory states S2 and S4, memory state S4 overlaps with memory states S3 and S5, memory state S5 overlaps with memory states S4 and S6, and memory state S6 overlaps with memory states S5 and S7. In some embodiments, all or some of the memory states do not overlap.

In the third phase of programming, each of memory states S1-S7 are tightened so that they no longer overlap with neighboring states. This is depicted graphically by FIG. 6D. The final result of the three phrase programming process is depicted in step 6E, which shows memory states S0-S7. In some embodiments, memory state S0 is wider than memory states S1-S7.

In some embodiments, those memory cells to be programmed to memory state S4 are not programmed during the second phase and, therefore, remain in intermediate state IM. During the third programming phase, the memory cells are programmed from IM to S4. In other embodiments, memory cells destined for other states can also remain in IM or E during the second phase.

Figure 6E:
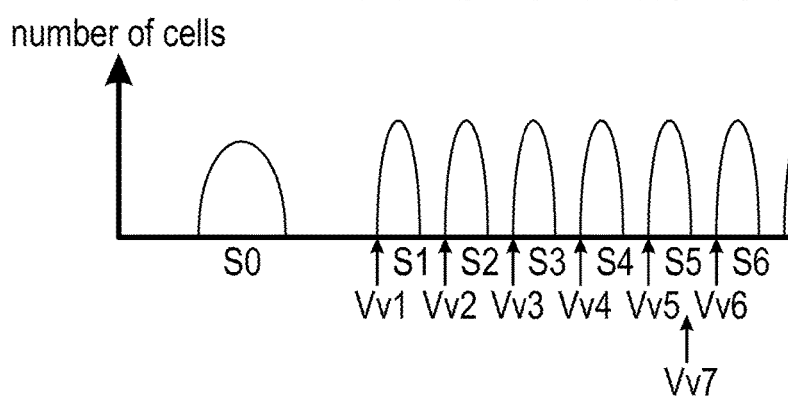

FIG. 6E shows eight voltage threshold distributions, corresponding to eight memory states. The first voltage threshold distribution (memory state) S0 represents memory cells that are erased. The other seven voltage threshold distributions (memory states) S1-S7 represent memory cells that are programmed and, therefore, are also called programmed states. Each voltage threshold distribution (memory state) corresponds to predetermined values for the set of data bits. The specific relationship between the data programmed into the memory cell and the voltage threshold levels of the cell depends upon the data encoding scheme adopted for the cells. In one embodiment, data values are assigned to the voltage threshold ranges using a Gray code assignment so that if the voltage threshold of a memory erroneously shifts to its neighboring physical state, only one bit will be affected. Adjacent memory states are memory states that are next to each other with respect to voltage threshold (or other attribute used to determine data value). For example, memory states S3 and S4 are adjacent memory states, and memory states S6 and S7 are adjacent memory states.

FIG. 6E also shows seven verify reference voltages, Vv1, Vv2, Vv3, Vv4, Vv5, Vv6, and Vv7. When programming memory cells to memory state S1, the system will test whether those memory cells have a voltage threshold greater than or equal to Vv1. When programming memory cells to memory state S2, the system will test whether the memory cells have threshold voltages greater than or equal to Vv2. When programming memory cells to memory state S3, the system will determine whether memory cells have their voltage threshold greater than or equal to Vv3. When programming memory cells to memory state S4, the system will test whether those memory cells have a voltage threshold greater than or equal to Vv4. When programming memory cells to memory state S5, the system will test whether those memory cells have a voltage threshold greater than or equal to Vv4. When programming memory cells to memory state S6, the system will test whether those memory cells have a voltage threshold greater than or equal to Vv6. When programming memory cells to memory state S7, the system will test whether those memory cells have a voltage threshold greater than or equal to Vv7.

Figures 6F, 6G:
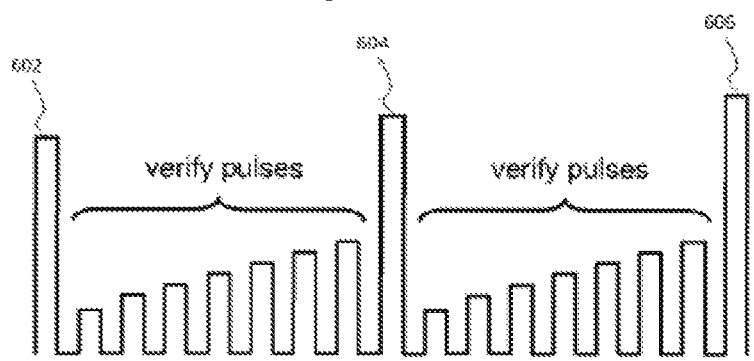

The technology described herein can also be used with other types of programming such as full sequence programming. In some embodiments, memory states S1-S7 can overlap, with controller 122 relying on ECC to identify the correct data being stored. FIG. 6F shows one example of how data is encoded for the memory states of FIG. 6A when programmed via a multiple stage programming sequence.

Referring now to FIG. 6G, an illustrative diagram of pulses applied to control gates of a set of memory cells during programming and verifying thereof is shown, according to an example embodiment. As shown, to program the set of memory cells to target memory states (e.g., desired ones of the memory states S1, S2, S3, S4, S5, S6, and S7 illustrated in FIG. 6E), a series of program pulses 602, 604, and 606 are applied to control gates of the memory cells. In one embodiment, each sequential one of the program pulses 602, 604, and 606 increases by a predetermined step size (e.g., 0.1 V, 0.2 V, 0.3 V, etc.). During time intervals between the program pulses 602, 604, and 606, a series of verification pulses is applied to the control gates to measure the conduction current of the memory cells. In one embodiment, when performing full sequence programming, the verification process between programming pulses will test for each of the memory states S1-S7. Therefore, FIG. 6G shows seven verify pulses that have magnitudes corresponding to verify target levels Vv1, Vv2, Vv3, Vv4, Vv5, Vv6, and Vv7 described with respect to FIG. 6E. The conduction current of the memory cells resulting from application of the verification pulses is measured via the sense circuitry 470 associated with the memory cells. For example, after application of a particular verification pulse, the rate of discharge of a capacitor within the sense circuitry 470 may be measured to determine the existence of conduction current for a particular memory cell. For other methodologies that may be used in detecting the conduction of a memory cell, see U.S. Pat. No. 7,023,736, incorporated by reference in its entirety.

If the conduction current is measured to be greater than or equal to or equal to a threshold value, then that the memory cell is turned on and the voltage applied to the word line is greater than or equal to or equal to the voltage threshold of the memory cell. If the conduction current is not measured to be greater than or equal to or equal to the threshold value, then the memory cell did not turn on and the voltage applied to the word line is not greater than or equal to the voltage threshold of the memory cell. Accordingly, the memory cells' response to each of the verification pulses at the verify target levels Vv1, Vv2, Vv3, Vv4, Vv5, Vv6, and Vv7 may be used to determine the respective state that the memory cell has been programmed to. If the measured memory state of a particular memory cell matches a target memory state for that cell (i.e., if the voltage threshold is within a range used to define the target memory state), a bit line latch associated with that cell is set to a program inhibit voltage to prevent further programming of the memory cell. As such, at any point in the sequence of pulses shown in FIG. 6G, any number of memory cells being programmed may be individually sensed to have reached a target memory state and inhibited from further programming.

Figure 7:
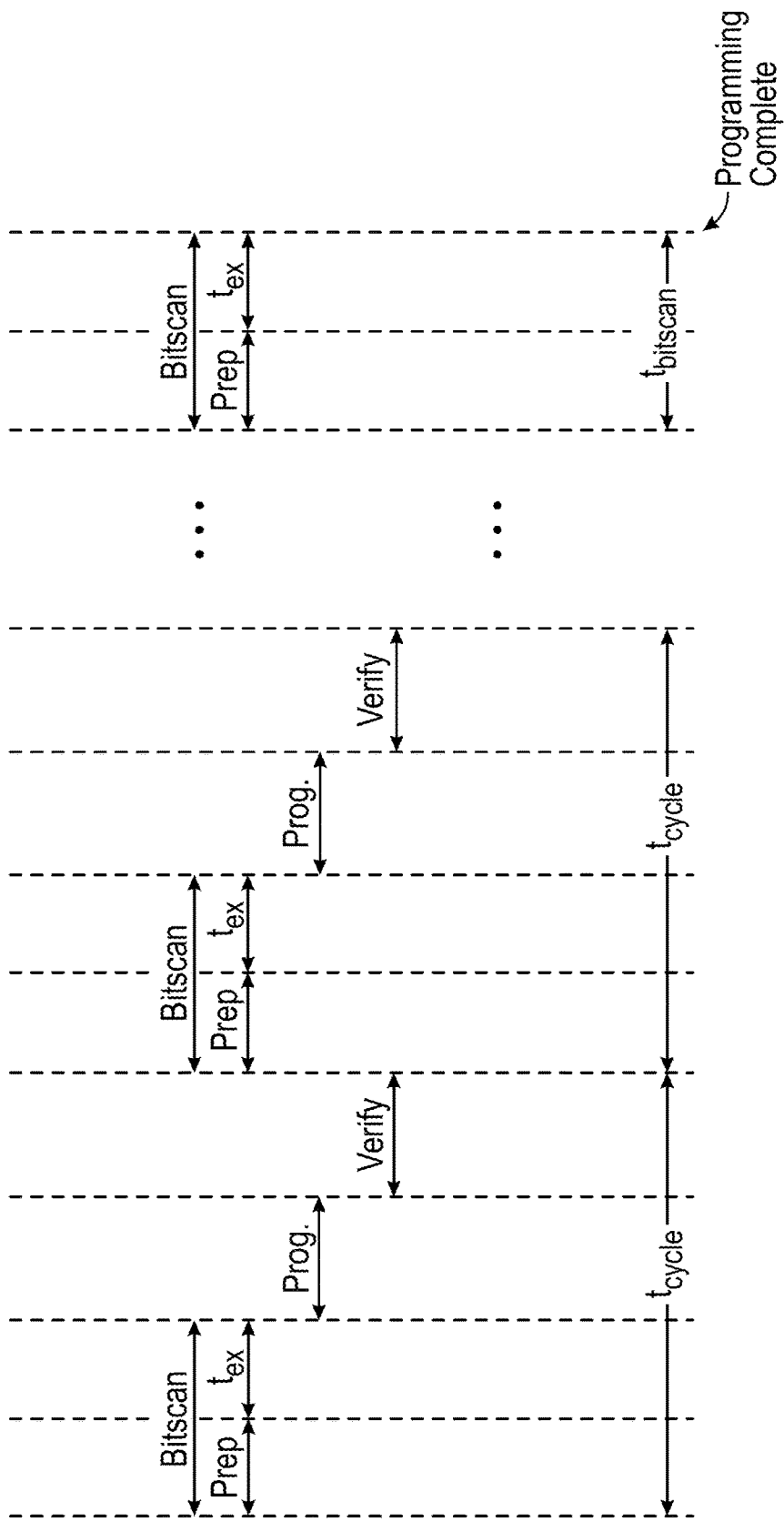
FIG. 7 is a time-flow diagram of a programming cycle for a set of memory cells, according to an example embodiment.

FIG. 7 shows a timing diagram for a programming sequence for a set of memory cells, according to an example embodiment. Dimensions in FIG. 7 and other timing diagrams are not to scale and are for illustration only. Pre-lockout preparation is performed initially. This typically includes time needed to move the data being programmed to the appropriate internal latches in peripheral circuits of the memory array. Then a bitscan is performed to see if any further programming is needed (even though no programming has occurred, it is possible that the data is such that cells are already in their memory states, i.e. the data corresponds to cells in the erased state). The bitscan is performed in parallel with preparation ("Prep") for programming. Such preparation for programming may include pre-charging bit lines that are to be locked out, and applying appropriate voltages to word lines near the word line that is being programmed (boosting). The particular preparation required may depend on the memory design.

After the bitscan is completed and it is determined that the cells are not in their target memory states (i.e., at least some threshold number of cells still require further programming), additional programming is performed ("Prog"), where one or more programming pulses are applied to the set of memory cells. Then a verification step ("Verify") is performed to read data back from the cells. This data is then used for the next bitscan to determine if a further programming step is needed. Thus, in this example, a programming cycle includes a bitscan step (which is performed partially in parallel with program preparation for the subsequent programming step), a programming step, and a verification step.

In various embodiments, the programming cycle of FIG. 7 is representative of programming memory cells in a memory array to a single memory state. FIG. 7 shows two complete cycles but it will be understood that more than two cycles are generally used but are omitted here (as indicated by dotted line). In general, programming completion does not require that all of the cells are in their memory states, but instead requires that at least some threshold number of cells are in their memory states. Generally, the threshold number that is selected depends on the Error Correction Code (ECC) capacity of the system in question. ECC allows detection and correction of some number of errors. When the number of errors exceeds the maximum, then the data may be uncorrectable, and thus unrecoverable. Even below the limit of a given ECC system, large numbers of errors may make correction very difficult so that ECC consumes significant resources and requires significant time. Thus a threshold number is generally selected that corresponds to an error rate which is correctable by the ECC system within a given time (e.g. before a time-out would occur, or within a time specified by a standard).

In various embodiments, the programming cycle of FIG. 7 is representative of programming memory cells in a memory array to a single memory state. In other words, once a first cycle is completed with respect to a set of memory cells, a second cycle may begin that corresponds to another memory state. In an example, for the plane 502A of memory cells shown in FIG. 5, a first cycle may be performed to program a pre-identified subset of the memory cells of the plane 502A to the first memory state S1 shown in FIG. 6A. After the cycle completes (i.e., after the final bitscan reveals that a percentage of the pre-identified subset of memory cells have reached the memory state S1), a second cycle may begin to program another pre-identified subset of memory cells to the second memory state. After a number of such cycles are performed such that another pre-identified subset of memory cells has reached the memory state S7, the plane 502A may be inhibited from further programming pulses being applied thereto. For example, the state machine 222 may include control logic configured to independently isolate the plane 502A from application of further program pulses. In other words, the control logic effectively opens a switch that, when closed, enables program pulses to reach the plane 502A. In an example, this control logic may be configured such that a to open first switch that, when closed, enables program pulses to reach the first plane 502A while a second switch remains closed to enable program pulses to reach the second plane 502B. This enables one plane to be programmed while another is isolated from additional program pulses. As will be appreciated, these switches may be embodied as physical switches (e.g., disposed along conduction pathways connecting the state machine 222 to the respective planes 502A and 502B) rather than as control logic.

Figure 8A:
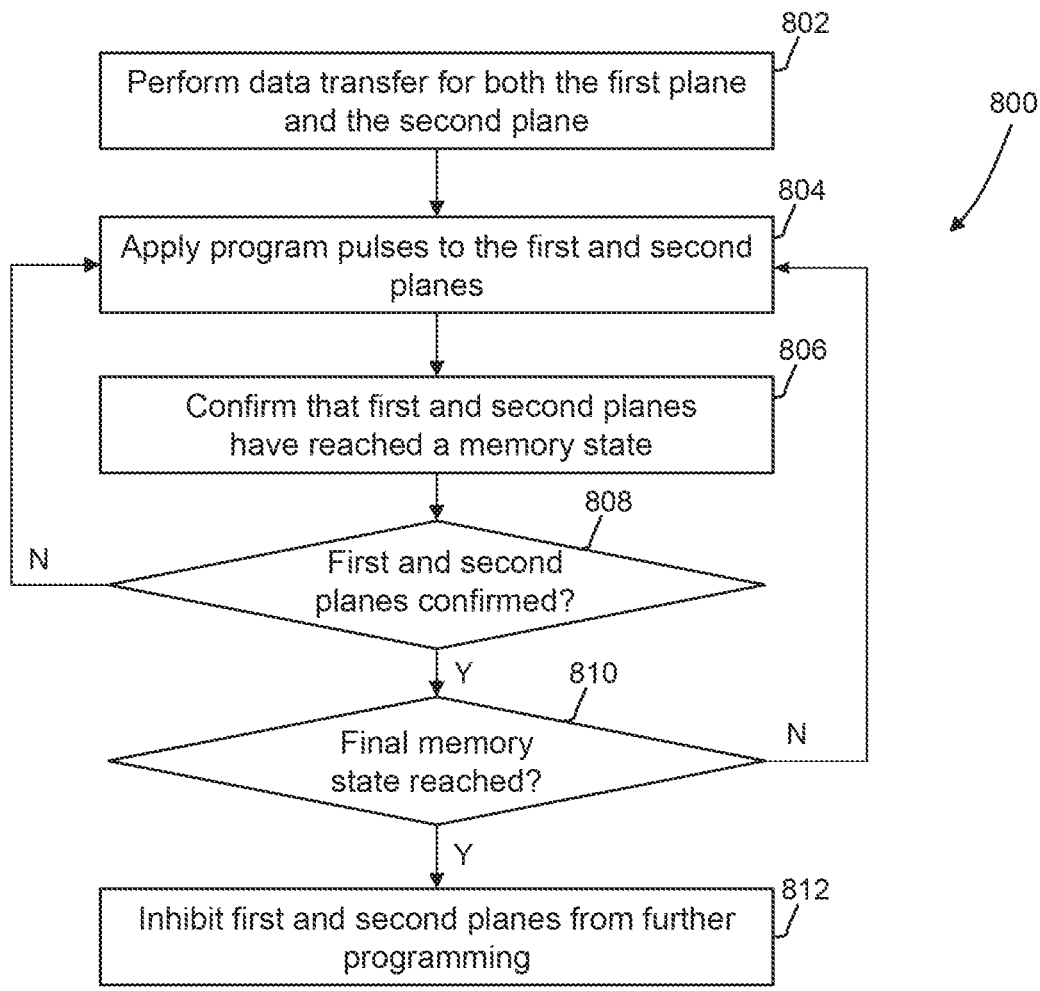
FIG. 8A is a flow diagram of a process for programming a multi-plane memory array, according to an example embodiment.

FIG. 8A shows a flow diagram of a prior art process 800 for programming planes of memory cells in parallel. Process 800 may be performed by control circuitry 220 of the memory array 500 shown in FIG. 5 to program memory cells in the planes 502A and 502B. In an operation 802, a data transfer is performed for each plane in a memory array. In an example, the data is transferred to data latches 494 corresponding to memory cells in both planes 502A and 502B of the memory array 500 shown in FIG. 5. Additionally, the control circuitry 220 provides addresses to the read/write circuitry 504A and 504B defining locations to which the transferred data is to be written. As will be understood, additional operations may be performed at this stage to prepare the memory cells for programming. For example, voltages may be applied to bit lines that are to be locked out or boosting of word lines to be programmed may be performed. The particular preparation required may depend on the memory design.

In an operation 804, program pulses are applied to the memory cells being programmed. For example, under control of the state machine 222, the control circuitry 220 may apply voltages to control gates (e.g., via selected word lines) associated with memory cells at the addresses being programmed. In some implementations, the magnitude of the program pulses applied increase by a predetermined step size. Accordingly, a first program pulse applied to the control gates is smaller in magnitude than other program pulses applied in successive cycles described herein. Between such program pulses, verification pulses are applied to measure the charge level at the control gates and determine if the memory cells have reached the memory state. For example, sensing logic may be provided in parallel to processors 492 in sense blocks 300 associated with programmed memory cells in each of the planes 502A and 502B. Via the sensing logic, the processors 492 may determine if current charge levels in the memory cells match that associated with the first memory state. As described herein, if a charge level in a control gate of a memory cell has reached a level corresponding to the first memory state, the bitline associated with the memory cell may be latched to prevent further programming of the memory cell.

In an operation 806, the control circuitry 220 confirms that the first and second planes have reached the a memory state. For example, after a first programming cycle, a read voltage associated with a first memory state may be applied to various sets of memory cells in each of the planes 502A and 502B, resulting in data transfers to buffers of bitscan circuits 498 associated with the sets of memory cells in each of the planes 502A and 502B. The bitscan circuits 498 count the number of cells that have been programmed to the first memory state and confirm that the memory state has been reached by a threshold number of memory cells. As such, bitscan operations are being performed simultaneously in each of the planes 502A and 502B with respect to the same target memory state. In an operation 808, the control circuitry 220 determines if the number of un-programmed memory cells is above or equal to a threshold. For example, the threshold may be determined based on a number of un-programmed cells that may be corrected via ECC encoding. If the number of memory cells that have not reached the first memory state is above the threshold, the operations 804 and 806 are re-performed until these threshold conditions are met.

After these threshold conditions are met, the control circuitry determines whether a final memory state has been reached in an operation 810. The final memory state may correspond to a highest target charge level that memory cells in the memory array 500 are to be programmed to (e.g., the state S7 shown in FIG. 6E). For example, after target numbers of cells in the planes 502A and 502B have reached a first memory state (e.g., the state S1 shown in FIG. 6E), the process 800 reverts back to 804 where an additional programming pulses are applied. In the re-performance of operations 806 and 808, however, the bitscan circuits 498 associated with various sets of memory cells in each of the planes 502A and 502B are configured to count numbers of memory cells that have reached an additional memory state (e.g., data obtained from application of a read voltage associated with the second memory state is used to load the buffers of the bitscan circuits 498). If there are more memory states after the additional memory state, the operations 804, 806, 810 are then substantially repeated for each additional memory state. Once the final memory state is reached in sets of memory cells in both planes 502A and 502B, the first and second planes 502A and 502B are inhibited from application of further program pulses in an operation 812. This inhibiting does not necessarily occur at the same time. For example, once the final state is reached, if target memory cells in the plane 502A reach the final memory state prior to the plane 502B, the plane 502A may be inhibited from further programming while additional program pulses are applied to the plane 502B to prevent program disturb.

Figure 8B:
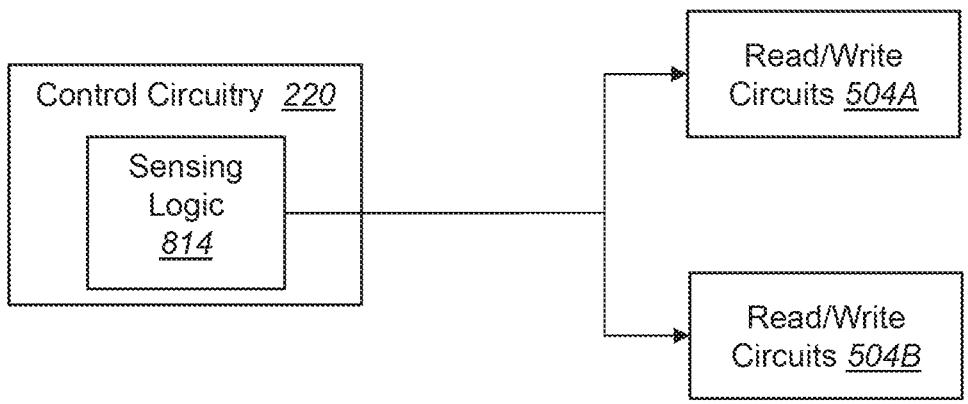
FIG. 8B is a block diagram of circuitry including sensing logic used to carry out the process described in FIG. 8A, according to an example embodiment.

Referring now to FIG. 8B, a block diagram of circuitry utilized in performance of the process 800 is shown, according to an example embodiment. As shown, the control circuitry 220 includes sensing logic 814 that is provided in parallel to read/write circuits 504A and 504B associated with each of the memory planes 502A and 502B. In various embodiments, the sensing logic 814 configures circuitry in each of the sense blocks 300 associated with various sets of memory cells in the planes 502A and 502B to perform various operations in response to charge levels in the memory cells being programmed to particular voltage levels. For example, when sets of memory cells in the planes 502A and 502B are being programmed to a particular memory state, the sensing logic may configure processors 492 in sense blocks 300 to inhibit bit lines in response associated memory cells reaching that memory state.

In some embodiments, the sensing logic 814 also causes the read/write circuits 504A and 504B to perform parallel bitscan operations with respect to memory cells in the respective planes 502A and 502B. For example, sensing logic 814 may cause respective bitscan circuits 498 of the read/write circuits 504A and 504B to simultaneously verify that threshold numbers of memory cells have reached a particular memory state. In such an implementation, only if threshold numbers of memory cells in both planes 502A and 502B have reached the memory state will programming advance to additional memory states.

Such an implementation has several shortcomings. These shortcomings are especially noticeable if the planes 502A and 502B program at different speeds. For example, memory cells in the plane 502A may have more defects (e.g., shorting between adjacent word lines, shorting between word lines and interconnects, shorting between word lines and the substrate, broken word lines, etc) than the memory cells in the plane 502B, and, as a result, require the application of a greater number of program pulses to reach a particular memory state. When this is the case, more program pulses are applied to the plane 502B than necessary.

In other words, because the process 800 links programming of each of the planes of a memory array together, the process 800 results in a lengthened programming process for the faster memory planes. In an example, target cells in the plane 502B may reach the memory state S3 shown in FIG. 6A prior to target cells in the plane 502A. However, since additional programming preparations for a later memory state are only performed when both the planes 502A and 502B are confirmed, the plane 502B is prevented from moving on to additional memory states until the target cells in the plane 502A are verified to have reached the memory state S3. As a result, the faster plane 502B is prevented from reaching the final memory state S7 and subjected to a greater number of programming pulses than necessary. This may result in program disturb in the faster plane 502B where final charge levels of memory cell of the faster plane 502B fail to correspond to target charge levels.

Figure 9A:
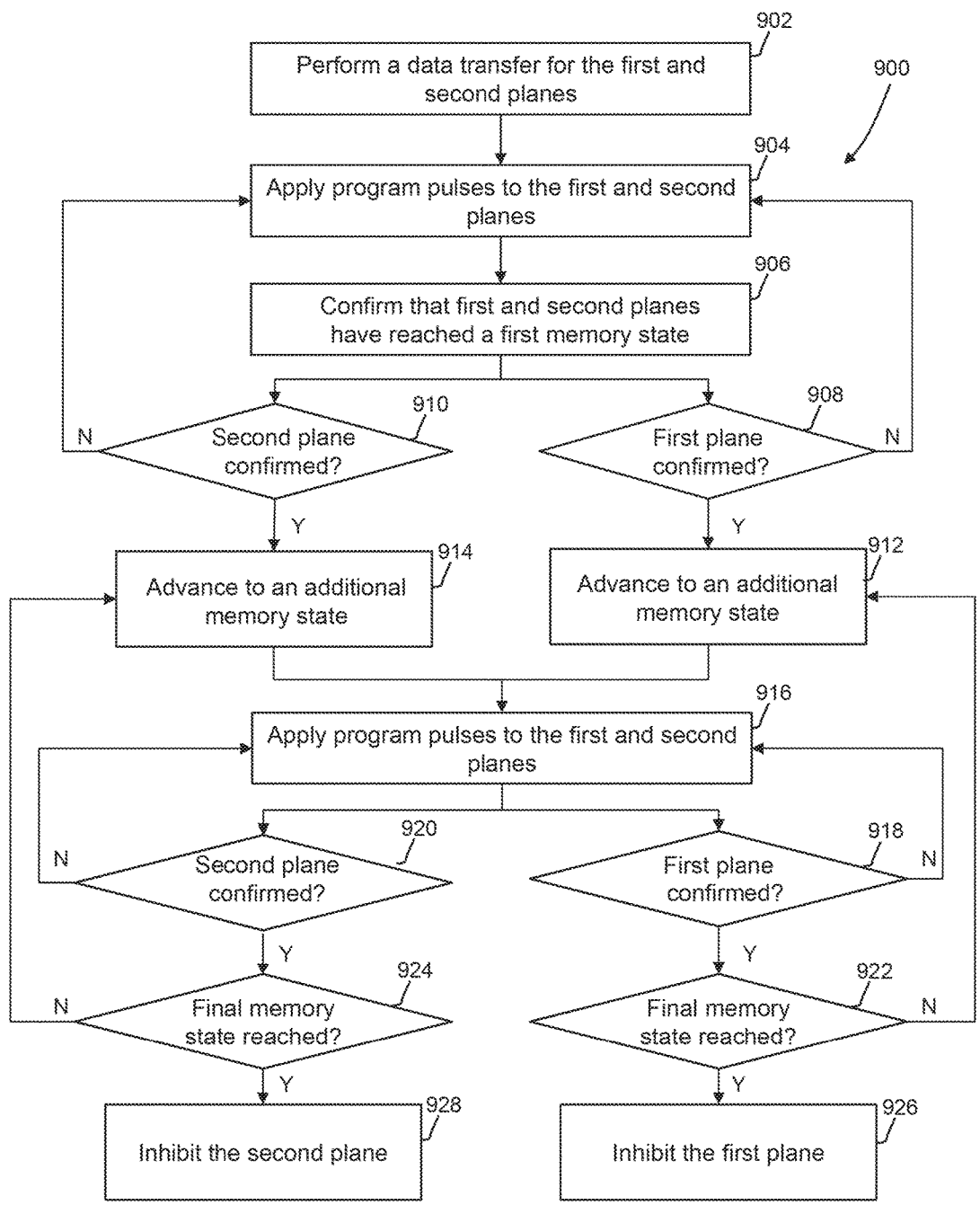
FIG. 9A is a flow diagram of a process for programming a multi-plane memory array, according to an example embodiment.

Referring now to FIG. 9A, a flow diagram of a process 900 for programming an array of memory cells is shown, according to an example embodiment. Process 900 may be performed via control circuitry 220 of the memory array 500 to program respective memory cells of the memory array 500 to respective target levels. In an operation 902, a data transfer is performed for each plane in a memory array. In an example, the data is transferred to data latches 494 corresponding to memory cells in both planes 502A and 502B of the memory array 500 shown in FIG. 5. Additionally, the control circuitry 220 provides addresses to the read/write circuitry 504A and 504B defining locations to which the transferred data is to be written. As will be understood, additional operations may be performed at this stage to prepare the memory cells for programming. For example, voltages may be applied to bit lines that are to be locked out or boosting of word lines to be programmed may be performed. The particular preparation required may depend on the memory design.

In an operation 904, program pulses are applied the memory cells being programmed. For example, under control of the state machine 222, the control circuitry 220 may apply voltages to control gates (e.g., via selected word lines) associated with memory cells at the addresses being programmed. In some implementations, the magnitude of the program pulses applied increase by a predetermined step size. Accordingly, a first program pulse applied to the control gates is smaller in magnitude than other program pulses applied in successive cycles described herein. Between such program pulses, verification pulses are applied to measure the charge level at the control gates and determine if the memory cells have reached the memory state. For example, sensing logic may be provided in parallel to processors 492 in sense blocks 300 associated with programmed memory cells in each of the planes 502A and 502B. Via the sensing logic, the processors 492 may determine if current charge levels in the memory cells match that associated with the first memory state. As described herein, if a charge level in a control gate of a memory cell has reached a level corresponding to the first memory state, the bitline associated with the memory cell may be latched to prevent further programming of the memory cell.

In an operation 906, the control circuitry 220 confirms that the first and second planes have reached the first memory state. In this regard, the control circuitry 220 may apply read voltages associated with the first memory state to memory cells in the planes 502A and 502B. Data read as a result of the read voltages may be transferred to buffers (e.g., tag latches) associated with bitscan circuits 498 associated with the memory cells. The bitscan circuits 498 associated with various sets of memory cells in each of the planes 502A and 502B may determine numbers of memory cells that have not yet the first memory state.

In operations 908 and 910, the control circuitry 220 independently confirms that the number of un-programmed memory cells in each of the planes 502A and 502B is below or equal to a threshold. As such, the control circuitry 220 causes separate bitscan operations to be performed independently with respect to the first and second planes 502A and 502B. As such, the number of un-programmed cells in the plane 502A may be compared with a first threshold and the number of un-programmed cells in the plane 502B may be compared with a second, different threshold. As described herein, the thresholds may be determined based on a number of un-programmed cells that may be corrected via ECC encoding.

If threshold numbers of target cells in only one of the planes 502A and 502B have reached the first memory state, that plane may advance to an additional memory state independent of the other plane. In an example, if the first plane 502A is not confirmed at 908 (i.e., if the number of target cells in the first plane 502A that has not yet reached the first memory state is above a threshold) and the second plane 502B is confirmed at 910 (i.e., if the number of target cells in the second plane 502B that has not yet reached the first memory state is below a threshold), the first plane 502A may revert back to operation 904, where additional programming pulses (e.g., of greater magnitude than those applied originally) are applied so that more target cells will reach the first memory state.

As this is occurring, the control circuitry 220 advances the second plane 502B to an additional memory state in an operation 914 by updating control logic for the second plane 502B. As a result, after additional programming pulses are applied to the first and second planes 502A and 502B (e.g., during an operation 916), the control circuitry 220 causes a read voltage associated with another memory state (e.g., the second memory state) to be applied to memory cells in the second plane 502B. This may occur at the same time that the control circuitry 220 causes a read voltage associated with the first memory state to be applied to memory cells in the first plane 502A. As a result, data of the first memory state is transferred to buffers associated with the bitline circuits 498 of the first plane 502A during a re-performance of the operation 906 to confirm that the first plane 502A has reached the first memory state. At the same time, data of the second memory state is transferred to buffers associated with the bitline circuits 498 of the second plane in the performance of the operation 918 to confirm that the second plane 502B has reached the second memory state. Once the first plane 502A is confirmed to have reached the first memory state during a re-performance of the operation 908, the control circuitry advances the first plane 502A to an additional memory state in an operation 910 by updating control logic for the first plane 502A. Subsequent bitscan operations will be performed with respect to the additional memory state after application of additional program pulses.

As such, separate planes of a memory array may progress through the process 900 at different rates and be unaffected by one another. In various embodiments, the control circuitry 220 applies programming pulses to each of the planes in parallel. Such parallel pulses may represent either the operation 904 (i.e., when applied to a plane that has not yet been verified to have been programmed to the first memory state) or the operation 916 (i.e., when applied to a plane that has been verified to have reached the first or other memory states). In operations 918 and 920, the planes 502A and 502B are independently verified with respect to different memory states. For example, a first set of target cells of the first plane 502A may be confirmed with respect to the memory state S2 while a second set of target cells in the second plane 502B may be confirmed with respect to the memory state S7.

In operations 922 and 924, the control circuitry 220 independently determines if either of the planes 502A and 502B have reached the final memory state. In other words, the control circuitry 220 independently determines whether data has been transferred to buffers associated with bitscan circuits 498 of the first and second planes 502A and 502B that corresponds to the last memory state a programming sequence (e.g., the state S7 shown in FIG. 6E). If it has, then the control circuitry 220 independently inhibits the plane that has reached the final memory state.

As such, a faster plane may be inhibited from application of further program pulses irrespective of the state to which other planes are being programmed to. In an example, the faster plane 502B may have been confirmed with respect to the final memory state S7 during a time when the slower plane 502A is still being confirmed with respect to the first memory state 51. Thus, the process 900 enables memory arrays including planes having large disparities in programming speeds to be programmed while minimizing program disturb.

This is advantageous over previous approaches, which typically only allow faster planes to be inhibited if certain conditions are met. For example, some previous approaches allow inhibition of the faster plane only if the slower plane has reached detection for the last memory state. This insufficient in that it fails to account for the fact that the slower plane may never reach the last memory state. Other previous approaches only allow inhibition if program counter loops (e.g., indicative of a number of program-verify cycles) associated with different planes is greater than or equal to threshold criteria. Such approaches fail to account for large variations between programming speeds of the faster and slower planes. Additionally, such approaches are difficult to implement in cases where the memory array includes more than two planes. Since the present approach described herein treats each plane independently, the method accommodates any number of planes and any difference in speed among them.

Figure 9B:
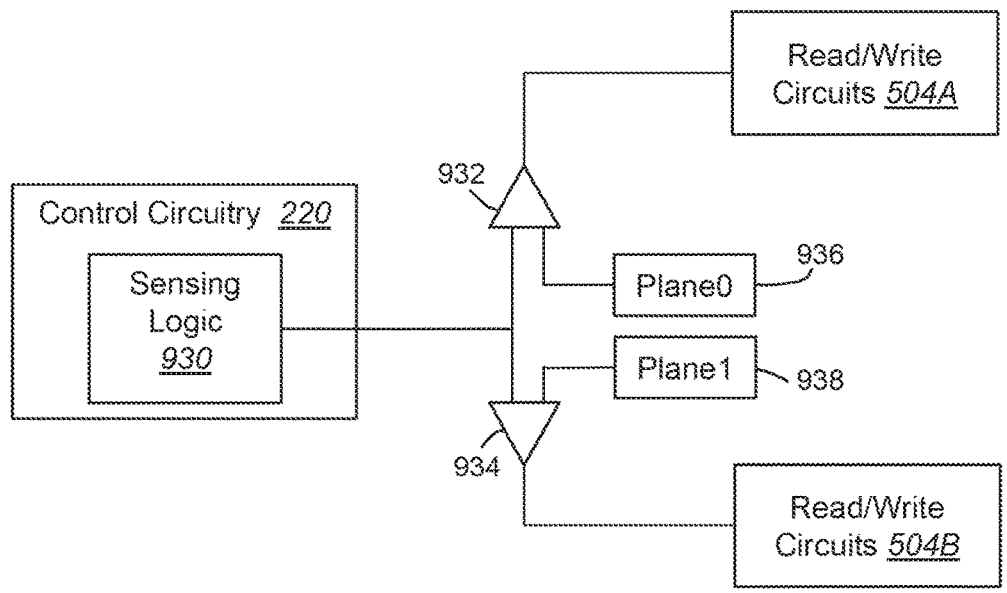
FIGS. 9B and 9C are block diagrams of circuitry including sensing logic used to carry out the process described in FIG. 9A, according to alternative example embodiments.

Referring now to FIG. 9B, a block diagram of circuitry used in performance of the process 900 is shown, according to an example embodiment. As shown, the control circuitry 220 includes sensing logic 930 configured to generate control signals provided to the read/write circuits 504A and 504B used to verify that memory cells in the planes 502A and 502B have reached respective target memory states. Because the process 900 involves independently verifying that numbers of target cells in the planes 502A and 502B have reached different target memory states, sensing logic 930 must provide different instructions to the read/write circuits 504A and 504B such that independent bitscan operations are performed with respect to the different planes 502A and 502B. In the example shown, the sensing logic 930 causes a single set of control signals to be generated. Different portions of the set of control signals are serially provided to the read/write circuits 504A and 504B depending on the programming status of the respectively planes 502A and 502B. The control signals may cause data transfers associated with different memory states to be transferred to data latches of different sets of target cells to be performed at different times.

In this regard, the control circuitry includes gates 932 and 934 and associated signal generators 936 and 938 for each of the planes 502A and 502B. The signal generators 936 and 938 control the signals provided to the read/write circuits 504A and 504B by altering the output signals at the gates 932 and 934. For example, the signal generators 936 and 938 may generate differently phased signals and provide these signals to the gates 932 and 934 such that control signals associated with different target memory states are provided to the different planes 502A and 502B in the memory array 500 simultaneously. As such, bitscan operations associated with different memory states may be performed independently, enabling the planes to reach a verification step for a final memory state independently of one another.

Figure 9C:
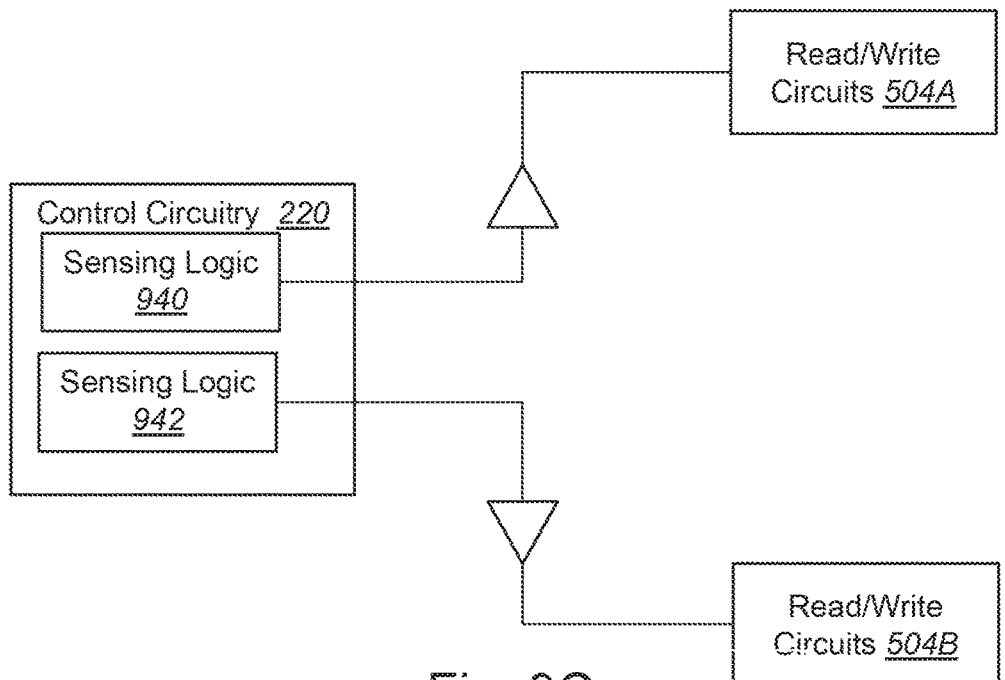

Referring now to FIG. 9C, a block diagram of circuitry used in performance of the process 900 is shown, according to an alternative example embodiment. In contrast to the example shown in FIG. 9B, the control circuitry includes first sensing logic 940 associated with the first plane 502A and second sensing logic 942 associated with the second plane 502B. Via the first sensing logic 940, control signals controlling sensing blocks 300 associated with the first plane 502A are provided. Via the second sensing logic 940, control signals controlling sensing blocks 300 associated with the second plane 502B are provided. As such, the control circuitry 220 may independently effectuate separate transfers to data latches associated with different sets of target cells to enable plane-independent bitscan operations to be performed.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus, comprising:
a first plane of memory cells including an associated first buffer;
a second plane of memory cells including an associated second buffer; and
a controller configured to:
transfer data corresponding to a first memory state to the first buffer; and
transfer data corresponding to a second memory state to the second buffer;
a state machine configured to apply program pulses to the first and second planes of memory cells; and
read/write circuitry configured to confirm that the first plane of memory cells has reached the first memory state and independently confirm that the second plane of memory cells has reached the second memory state by determining a number of memory cells in the first plane that have been programmed to the first memory state based on the data transferred to the first buffer and by determining a number of memory cells in the second plane that have been programmed to the second memory state based on the data transferred to the second buffer.

2. The apparatus of claim 1, wherein, in response to the read/write circuitry confirming that memory cells of the second plane have reached the second memory state, the state machine is configured to isolate the second plane from subsequent program pulses via control logic that effectively opens a switch directing program pulses to the second plane.

3. The apparatus of claim 1, wherein, in response to the read/write circuitry confirming that memory cells of the first plane have reached the first memory state and memory cells of the second plane have not reached the second memory state:
the controller is configured to transfer data to the first buffer associated with the second memory state; and
the state machine is configured to apply an additional program pulse to the first and second planes of memory cells.

4. The apparatus of claim 1, further comprising one or more bitscan circuits configured to determine the number of memory cells in the first plane that have been programmed to the first memory state and the number of memory cells in the second plane that have been programmed to the second memory state based on the data transferred to the second buffer.

5. The apparatus of claim 1, wherein the read/write circuitry includes detection circuitry configured to determine a program voltage level for the cells of the first and second planes, wherein, to independently confirm that memory cells in the first and second planes of memory cells have reached the first and second memory states, the read/write circuitry is configured to determine, by the detection circuitry, that threshold numbers of memory cells have reached a first memory state.

6. The apparatus of claim 5, wherein the detection circuitry includes a first detection circuit associated with the first plane and a second detection circuit associated the second plane, wherein the controller is further configured to provide separate control signals to the first and second detection circuits to determine the threshold numbers of memory cells have reached the first and second memory states.

7. The apparatus of claim 6, wherein the separate control signals are serially provided to the first and second detection circuits via the control circuit.

8. The apparatus of claim 6, wherein the control circuit includes separate control logic for the first and second planes and provides the separate control signals in parallel to the first and second detection circuits.

9. A method, comprising:
transferring data corresponding to different memory states to buffers associated with first and second planes of the array;
applying program pulses to the first and second planes in parallel; and
independently confirming that memory cells of the first and second planes of memory cells have reached the different memory states, by identifying numbers of memory cells in the first and second planes that have been programmed to the different memory states based on the data transferred to the buffers.

10. The method of claim 9, further comprising:
confirming that memory cells of the first plane have reached a second memory state; and
in response to confirming that memory cells of the first plane have reached the second memory state, inhibiting the first plane from application of further program pulses.

11. The method of claim 9, further comprising:
in response to confirming that memory cells have reached a first memory state during a time when memory cells of the second plane have not reached the first memory state, transferring data associated with the second memory state to a storage element associated with the first plane; and
applying an additional program pulse to the first and second planes of memory cells.

12. The method of claim 9, wherein the confirming that memory cells of the first and second planes have reached the different memory states includes determining that percentages of identified memory cells have reached the different memory states.

13. The method of claim 12, wherein the determining that percentages of the identified memory cells have reached the first and second memory states includes providing a first control signal to a first detection circuit associated with the first plane, the first control signal different from a second control signal provided to a second detection circuit associated with the second plane.

14. The method of claim 13, wherein the first and second control signals are serially provided to the first and second detection circuits.

15. The method of claim 13, wherein the first and second control signals are generated independently from one another and provided in parallel to the first and second detection circuits.

16. An apparatus, comprising:
a plurality of non-volatile memory cells, the plurality of non-volatile memory cells including a first set of non-volatile memory cells and a second set of non-volatile memory cells;
a first set of data latches associated with the first set of non-volatile memory cells;
a second set of data latches associated with the second set of non-volatile memory cells;
a controller configured to:
send first data to the first set of data latches, the first data including data associated with a first memory state for a first portion of the first set of non-volatile memory cells; and
send second data to the second set of data latches, the second data including data associated with the first memory state for a first portion of the second set of non-volatile memory cells;
a state machine configured to transmit a first programming pulse of an initial voltage level to the first set of non-volatile memory cells and the second set of non-volatile memory cells; and
one or more bitscan circuits configured to confirm that the first portion of the second set of non-volatile memory cells have reached the first memory state and that the first portion of the first set of non-volatile memory cells has not reached the first memory state, wherein in response to confirming that the first portion of the second set of non-volatile memory cells has reached the second memory state, the controller is configured to send third data to the second set of data latches, the third data including data associated with a second memory state for a second portion of the second set of non-volatile memory cells.

17. The apparatus of claim 16, wherein the first set of non-volatile memory cells is associated with a first plane and the second set of non-volatile memory cells is associated with a second plane.

18. The apparatus of claim 17, wherein, in response to the bitscan circuits confirming that the second portion of the second set of memory cells have reached the second memory state, the state machine is configured to prevent subsequent program pulses from being applied to the second set of non-volatile memory cells, wherein the bitscan circuits are further configured to confirm that the first portion of the first set of non-volatile memory cells has reached the first memory state; and
in response to the bitscan circuits confirming that the first portion of the first set of non-volatile memory cells have reached the first memory state, the controller is further configured to send fourth data to the first set of data latches, the fourth data including data associated with the second memory state for a second portion of the first set of non-volatile memory cells.

19. The apparatus of claim 18, wherein the state machine is further configured to transmit a second programming pulse to the first set of memory cells, the second programming pulse having a higher voltage level than the initial voltage level, wherein the bitscan circuits are configured to confirm that the second portion of the first set of non-volatile memory cells have reached the second memory state, wherein in response to the bitscan circuits confirming that the second portion of the first set of non-volatile memory cells have reached the second memory state, the state machine is configured prevent subsequent program pulses from being applied to the second set of non-volatile memory cells.

20. An apparatus, comprising:
means for transferring data corresponding to different memory states to buffers associated with different planes of a memory array;
means for applying programming pulses to the different planes; and
means for confirming that target numbers of memory cells in each of the different planes have reached the different memory states.

* * * * *